(12) United States Patent
Casper et al.

(10) Patent No.: US 6,633,506 B2
(45) Date of Patent: Oct. 14, 2003

(54) ANTIFUSE DETECTION CIRCUIT

(75) Inventors: Stephen L. Casper, Boise, ID (US); Chris G. Martin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/771,818

(22) Filed: Jan. 29, 2001

(65) Prior Publication Data

US 2002/0021610 A1 Feb. 21, 2002

Related U.S. Application Data

(62) Division of application No. 09/375,325, filed on Aug. 17, 1999, now Pat. No. 6,181,627, which is a continuation of application No. 09/140,956, filed on Aug. 27, 1998, now Pat. No. 6,084,814, which is a division of application No. 08/725,430, filed on Oct. 3, 1996, now Pat. No. 5,812,477.

(51) Int. Cl.[7] .............................................. G11C 11/40
(52) U.S. Cl. ................. 365/225.7; 365/96; 365/189.05; 365/189.09; 365/200
(58) Field of Search ................................ 365/225.7, 96, 365/189.01, 189.05, 200, 189.09; 327/526, 525

(56) References Cited

U.S. PATENT DOCUMENTS

| | | | |
|---|---|---|---|
| 5,166,556 A | 11/1992 | Hsu et al. .................. 307/465 |
| 5,166,566 A | 11/1992 | Bernhardt et al. ......... 310/90.5 |
| 5,200,652 A | 4/1993 | Lee ............................ 307/465 |
| 5,241,496 A | 8/1993 | Lowrey et al. ............... 365/96 |
| 5,257,222 A | 10/1993 | Lee .............................. 365/96 |
| 5,257,225 A | 10/1993 | Lee ............................ 365/185 |
| 5,324,681 A | 6/1994 | Lowrey et al. ............... 437/52 |
| 5,331,196 A | 7/1994 | Lowrey et al. ............. 257/529 |
| 5,334,880 A * | 8/1994 | Abadeer et al. ............ 307/219 |
| 5,418,738 A * | 5/1995 | Abadeer et al. ............ 165/100 |
| 5,426,614 A * | 6/1995 | Harward ................. 365/225.7 |
| 5,440,246 A * | 8/1995 | Murray et al. ................ 326/38 |
| 5,471,426 A | 11/1995 | McClure ..................... 365/200 |
| 5,581,505 A | 12/1996 | Lee ........................ 365/189.11 |
| 5,617,038 A * | 4/1997 | Houston ..................... 324/765 |
| 5,631,862 A | 5/1997 | Cutter et al. ................. 365/96 |
| 5,706,238 A | 1/1998 | Cutter et al. ............. 365/225.7 |
| 5,812,477 A * | 9/1998 | Casper et al. ............ 365/225.7 |
| 5,838,624 A * | 11/1998 | Pilling et al. ............ 365/225.7 |
| 5,892,716 A | 4/1999 | Ingalls ................... 365/189.05 |
| 6,011,742 A * | 1/2000 | Zheng ..................... 365/225.7 |
| 6,016,264 A | 1/2000 | Liu .............................. 365/96 |
| 6,020,777 A | 2/2000 | Bracchitta et al. .......... 327/525 |
| 6,028,798 A * | 2/2000 | Rpphparvar ............. 365/225.7 |
| 6,055,173 A * | 4/2000 | Mullarkey et al. ............ 365/96 |
| 6,084,814 A * | 7/2000 | Casper et al. ............ 365/225.7 |
| 6,108,261 A * | 8/2000 | Kim et al. ................ 365/225.7 |
| 6,133,778 A * | 10/2000 | Kim et al. ................... 327/525 |
| 6,181,627 B1 * | 1/2001 | Casper et al. ............ 365/225.7 |
| 6,255,895 B1 * | 7/2001 | Kim et al. ................... 327/530 |
| 6,323,720 B1 * | 11/2001 | Kim et al. ................... 327/525 |

FOREIGN PATENT DOCUMENTS

| | | | |
|---|---|---|---|
| EP | 0511560 | 11/1992 | |
| EP | 0525680 | 2/1993 | |
| EP | 0655743 | 5/1995 | |
| JP | 5-101687 | 4/1993 | ........... G11C/17/00 |
| JP | 8-23080 | 1/1996 | ........... H01L/27/10 |

OTHER PUBLICATIONS

Lee, J.M., "Cross–Coupled Latch for Memory Sensing", *IBM Technical Disclosure Bulletin*, vol. 17, No. 5, 1361–1362, (Oct. 1974).*

* cited by examiner

Primary Examiner—Viet Q. Nguyen
(74) Attorney, Agent, or Firm—Schwegman, Lundberg, Woessner & Kluth, P.A.

(57) ABSTRACT

An antifuse detection circuit is described which uses a latching circuit and two antifuses. The antifuses are coupled between the latch circuit and ground. The latching circuit described is a differential circuit which can detect which one of the two antifuses has been programmed. The circuit accurately detects an antifuse which has a relatively high resistance after being programmed.

25 Claims, 5 Drawing Sheets

ANTIFUSE DETECTION CIRCUIT

This application is a Divisional of U.S. application Ser. No. 09/375,325, filed Aug. 17, 1999, now U.S. Pat. No. 6,181,627 which is a Continuation of U.S. application Ser. No. 09/140,956, filed Aug. 27, 1998, now U.S. Pat. No. 6,084,814, which is a Divisional of U.S. application Ser. No. 08/725,430, filed Oct. 3, 1996, now U.S. Pat. No. 5,812,477.

TECHNICAL FIELD OF THE INVENTION

The present invention relates generally to integrated circuits and in particular the present invention relates to antifuse detection circuits.

BACKGROUND OF THE INVENTION

Programmable devices are commonly used for changing a circuit after it has been fabricated. One application of programmable devices is in the repair of integrated circuit memories. Integrated circuit memories are often fabricated with several redundant elements (rows or columns) of memory cell. Each redundant element has an associated comparison module which is formed by an array of programmable devices and which is capable of receiving a multi-bit address. The programmable devices of the array are selectively programmed to respond to a specific address as necessary to reroute memory addresses for replacing a redundant element for a failed memory element.

One type of programmable device that is commonly used for these applications is the anti-fuse. In its unprogrammed condition, the anti-fuse functions as a capacitor and presents a very high resistance on the order of 10 Megohms. To program an anti-fuse, its connections are shorted together providing a relatively low resistance path through the antifuse, typically presenting a resistance of about 200 to 500 ohms.

Typically, a detection circuit is used to determine the condition of an anti-fuse. The detection circuit includes a pull-up transistor that is connected in series with the antifuse between the Vcc rail and the ground rail of the detection circuit. A voltage level detecting circuit connects the ungrounded terminal of the anti-fuse at a detection node to the output of the detection circuit. For an unblown condition for the anti-fuse, a voltage at approximately Vcc is provided at the detection node. For a blown condition for the antifuse, the shorted anti-fuse connects ground to the input of the level detecting circuit. A latch arrangement, triggered by the voltage level detecting circuit, is provided to isolate the detection node and the blown anti-fuse from the Vcc rail for the blown condition for the anti-fuse.

In programming an anti-fuse, the anti-fuse may not blow clean. In such case, the anti-fuse presents a relatively high resistance which can be on the order of 400 K ohms. Accordingly, a partially blown anti-fuse forms a voltage divider in combination with the pull-up transistor so that rather than being at ground, the voltage provided at the detection node will trip the level detecting circuit, so that the detection circuit will produce an erroneous output.

For the reasons stated above, and for other reasons stated below which will become apparent to those skilled in the art upon reading and understanding the present specification, there is a need in the art for a detection circuit which can identify a programmed device, in particular a high resistance anti-fuse.

SUMMARY OF THE INVENTION

The above mentioned problems with detection circuits and other problems are addressed by the present invention and which will be understood by reading and studying the following specification. A detection circuit is described which uses multiple programmable devices and a latch to detect a programmed device.

An antifuse detection circuit is described which uses a latching circuit and two antifuses. The antifuses are coupled between the latch circuit and ground. The latching circuit described is a differential circuit which can detect which one of the two antifuses has been programmed. The circuit accurately detects an antifuse which has a relatively high resistance after being programmed.

In particular, the present invention describes an antifuse detection circuit comprising a latch circuit, and a plurality of antifuses coupled between the latch circuit and a common reference voltage.

In another embodiment, an antifuse detection circuit is described which comprises first and second antifuses. Each antifuse having a first node connected to a common reference voltage, and a second node connected to a latch circuit. The latch circuit comprises first and second cross-coupled p-channel transistors. A drain of the first and second p-channel transistors is connected to a second reference voltage. A source of the first p-channel transistor is coupled to a gate of the second p-channel transistor, and a source of the second p-channel transistor is coupled to a gate of the first p-channel transistor. The first antifuse is coupled to the source of the first p-channel transistor, and the second antifuse is coupled to the source of the second p-channel transistor.

In yet another embodiment, a memory device is described which comprises an array of memory cells, and control circuitry. The control circuitry comprises a latch circuit having cross-coupled transistors and a plurality of antifuses coupled between the latch circuit and a common reference voltage.

A method is described for detecting a program antifuse. The method comprises the steps of programming a first antifuse to create a conductive path between first and second conductive plates, coupling the first conductive plate to a first reference voltage, and coupling the second conductive plate to a latch circuit. The method further includes the steps of coupling a first conductive plate of an un-programmed second antifuse to the first reference voltage, coupling a second conductive plate of the second antifuse to the latch circuit, and activating the latch circuit.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention provides a detection circuit for detecting the condition of a programmable device in an integrated circuit device. In an exemplary embodiment, the detection circuit is used to detect the condition of an anti-fuse that is employed in an integrated circuit memory, such as in a match fuse bank circuit which is used to reroute memory addresses for replacing a redundant memory row or column portion for a failed memory row or column portion. However, the detection circuit can be used anywhere an anti-fuse is used.

In the unblown state, the anti-fuse functions as a capacitor and presents a high impedance, typically on the order of about 10 Megohms, for example. In the blown state, the anti-fuse is changed permanently to a low-resistance structure, presenting a resistance of about 200 to 500 ohms, for example, if a clean blow is produced during programming. However, if the anti-fuse is only partially blown, the anti-fuse 10 can present a very high resistance on the order of about 400 K ohms, for example.

Figure 1:
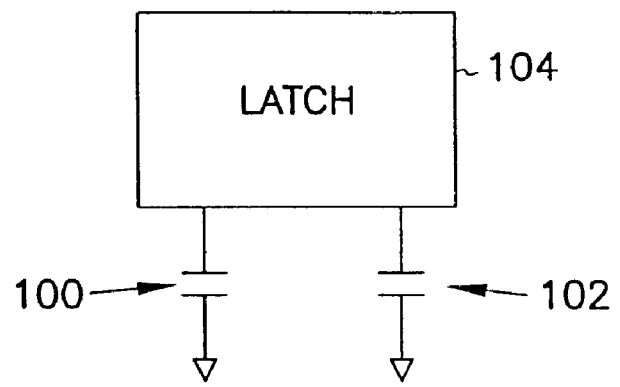
FIG. 1 is a detection circuit of the present invention.

FIG. 1 illustrates the detection circuit of the present invention provided in an integrated circuit. Two antifuses 100 and 102 are connected to a latch circuit 104. One of the antifuses is intended to be programmed during the manufacture of the integrated circuit. The latch circuit detects which of the two antifuses has been programmed and produces an appropriate output. The latch circuit can detect partially programmed antifuses. That is, the latch can detect a programmed antifuse even if the antifuse has a relatively high resistance after programming.

Figure 2:
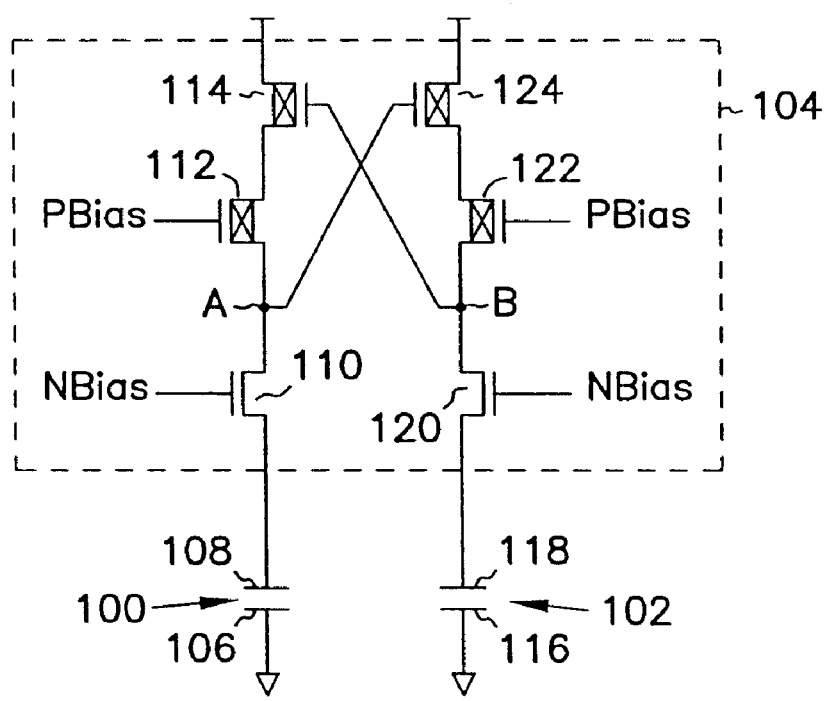
FIG. 2 is a schematic diagram of a detection circuit of the present invention.

FIG. 2 is a more detailed schematic diagram of a detection circuit of the present invention including antifuses and a latch 104 (comprises of cross-coupled transistors 114 and 124. A first antifuse 100 has one plate 106 coupled to ground potential and a second plate 108 connected to an n-channel transistor 110. The gate of the n-channel transistor is connected to receive a bias voltage, and its drain is connected to p-channel transistor 112. The drain of transistor 110 is labeled node A in FIG. 2. The gate of transistor 112 is connected to receive a second bias voltage. P-channel transistor 114 is connected between transistor 112 and a positive voltage supply.

A second antifuse 102 has one plate 116 coupled to ground potential and a second plate 118 connected to an n-channel transistor 120. The gate of the n-channel transistor is connected to receive a bias voltage, and its drain is connected to p-channel transistor 122. The drain of transistor 120 is labeled node B in FIG. 2. The gate of transistor 122 is connected to receive a second bias voltage. P-channel transistor 124 is connected between transistor 122 and a positive voltage supply. The gate of transistor 114 is connected to node B, and the gate of transistor 124 is connected to node A.

In operation, transistors 110–124 function as a differential latch. That is, nodes A and B are latched to opposite states depending upon the voltage drops across antifuses 100 and 102. By programming one of the antifuses, the remaining antifuse operates as a reference circuit.

P-channel transistors 112 and 122 are provided to assist a programmed antifuse in correcting nodes A and B. That is, if nodes A and B are latched in the incorrect state, the p-channel transistors reduce the voltage potential on the nodes to assist the programmed antifuse in overcoming the incorrect state. N-channel transistors 110 and 120 are provided to reduce the potential drop across antifuses 100 and 102, particularly when the antifuses are in an unprogrammed state. This is to insure that a large voltage drop is not provided across the plates of the antifuse and erroneously programs the antifuse.

Figure 3:
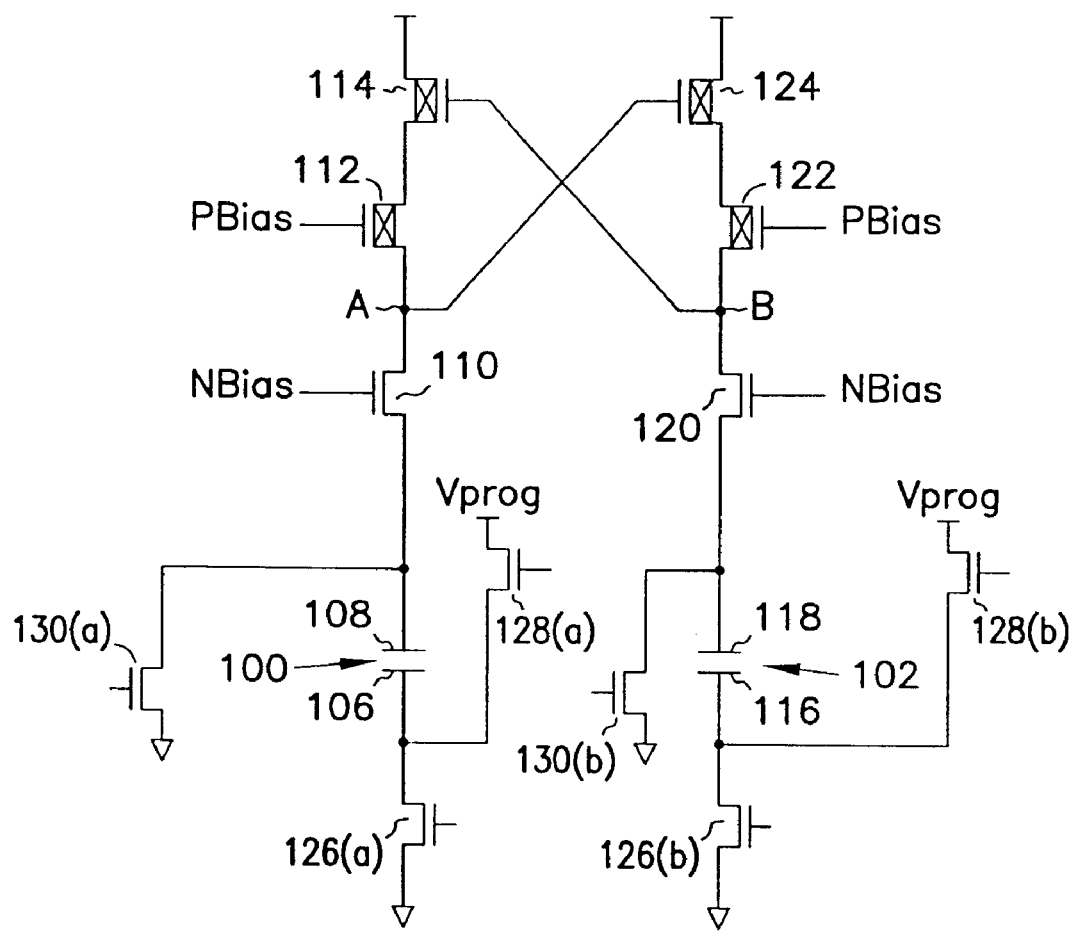
FIG. 3 is a schematic diagram of a detection circuit of the present invention including programming circuitry.

FIG. 3 illustrates one embodiment of program circuitry which can be used to program one of the antifuses 100 or 102. The program circuit includes transistors 126, 128 and 130. Under normal operation, isolation transistors 126(a) and 126(b) are turned on such that plates 106 and 116 of the antifuses are coupled to ground. To program one of the antifuses, transistors 126(a) and 126(b) are turned off to isolate the antifuses from ground. Likewise transistors 110 and 120 are turned off to electrically isolate the antifuses from the latch circuit. Transistors 128(a) and 128(b) are then turned on to couple plates 106 and 116 to a program voltage, Vprog. Either transistor 130(a) or transistor 130(b) is then activated to couple either plate, 108 or 118 to ground. It will be appreciated that the antifuse coupled to Vprog and ground will be programmed such that a low resistance path is created between the antifuse plates, as known to one skilled in the art. The program transistors 128 and 130, therefore, are designed to withstand a substantial current. As stated above, the process of programming an antifuse is subject to variables and the resultant antifuse resistance can vary greatly. For example, an unprogrammed antifuse resistance is in the order of 10 M ohms, and the programmed antifuse can vary between tens of ohms and several hundred thousand ohms.

Figure 4:
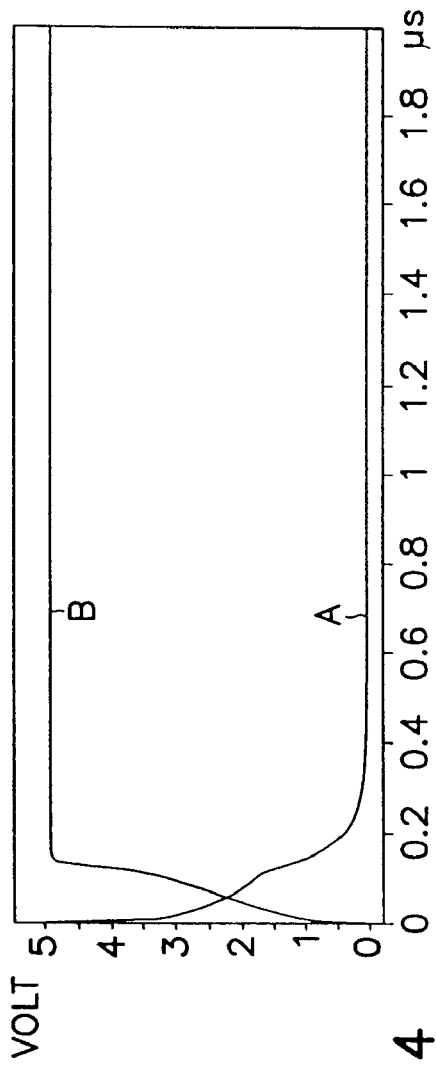
FIG. 4 is a timing diagram of the operation of the circuit of FIG. 2.

The timing diagram of FIG. 4 illustrates the operation of the circuit of FIG. 2 where antifuse 100 has been programmed using the program circuitry described with reference to FIG. 3. For purposes of illustration, antifuse 100 has been programmed and has a plate-to-plate resistance of approximately 400 k ohms. Antifuse 102 is unprogrammed and has a plate-to-plate resistance of approximately 10 M ohms. To illustrate the ability of the detection circuit to correctly detect a programmed antifuse, Nodes A and B are initially at a high voltage level and a low voltage level, respectively. With transistors 110, 112, 120 and 122 active, antifuse 100 begins to pull node A low through transistor 110. Transistor 124 begins to turn on as node A goes low, thus pulling node B high and turning off transistor 114. Node A is pulled low and node B is pulled high to indicate that antifuse 100 has been programmed and antifuse 102 is unprogrammed.

Figure 5:
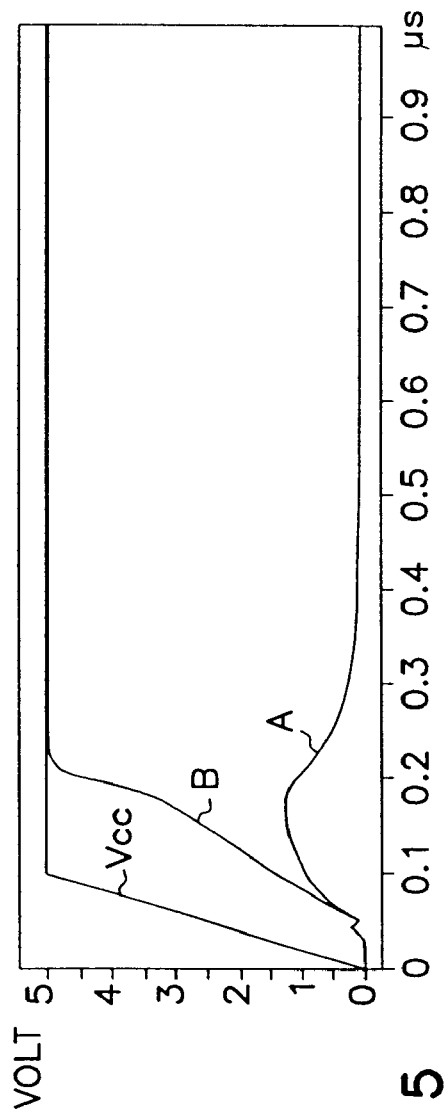
FIG. 5 is another timing diagram of the operation of the circuit of FIG. 2.
Figure 6:
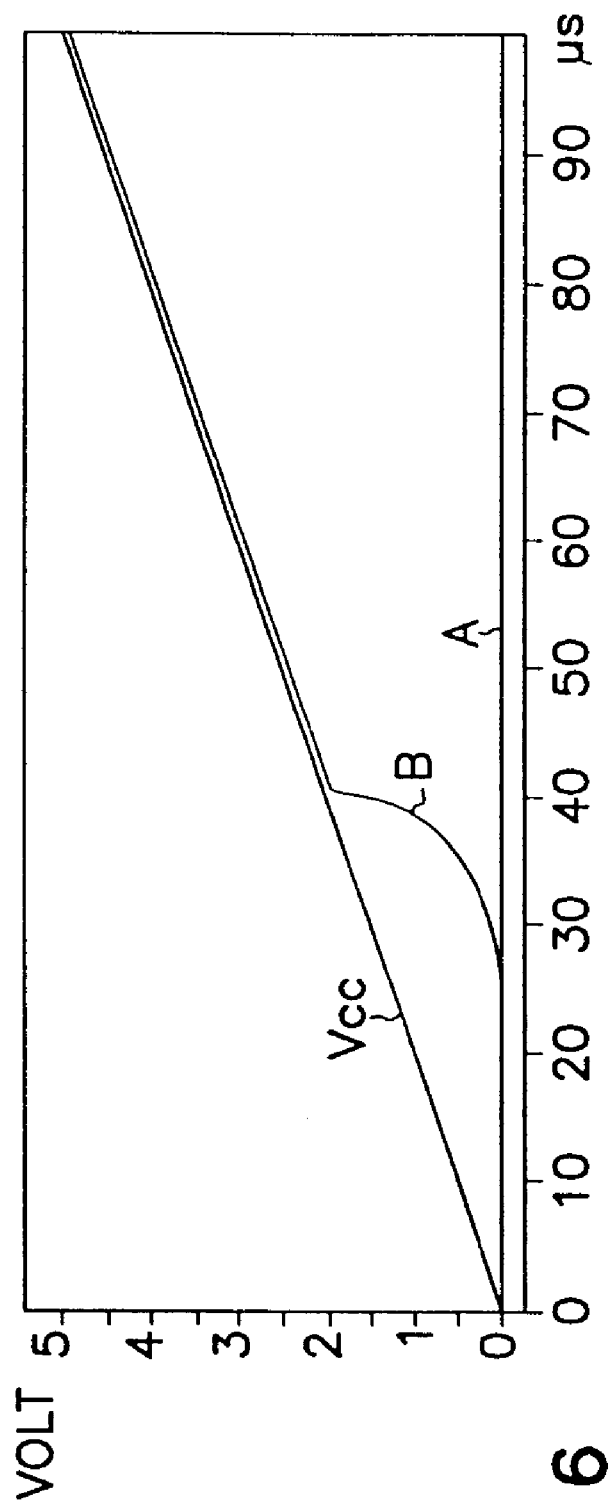
FIG. 6 is yet another timing diagram of the operation of the circuit of FIG. 2.

FIG. 5 is a timing diagram of the circuit of FIG. 2 having antifuse 100 programmed. Antifuse 100 has a plate-to-plate resistance of approximately 400 k ohms. Antifuse 102 is unprogrammed and has a plate-to-plate resistance of approximately 10 M ohms. The timing diagram illustrates the ability of the detection circuit to correctly identify a programmed antifuse upon initial power-up. Upon power-up, the supply voltage, Vcc, transitions from 0 volts to 5 volts in 100 ns. Nodes A and B are stabilized at the appropriate values within approximately 400 ns. Further, FIG. 6 illustrates the same circuit operation where the power supply transitions to 5 volts in 100 $\mu$s. In this power-up illustration, Nodes A and B are stabilized at the appropriate values within approximately 40 $\mu$s.

Figure 7:
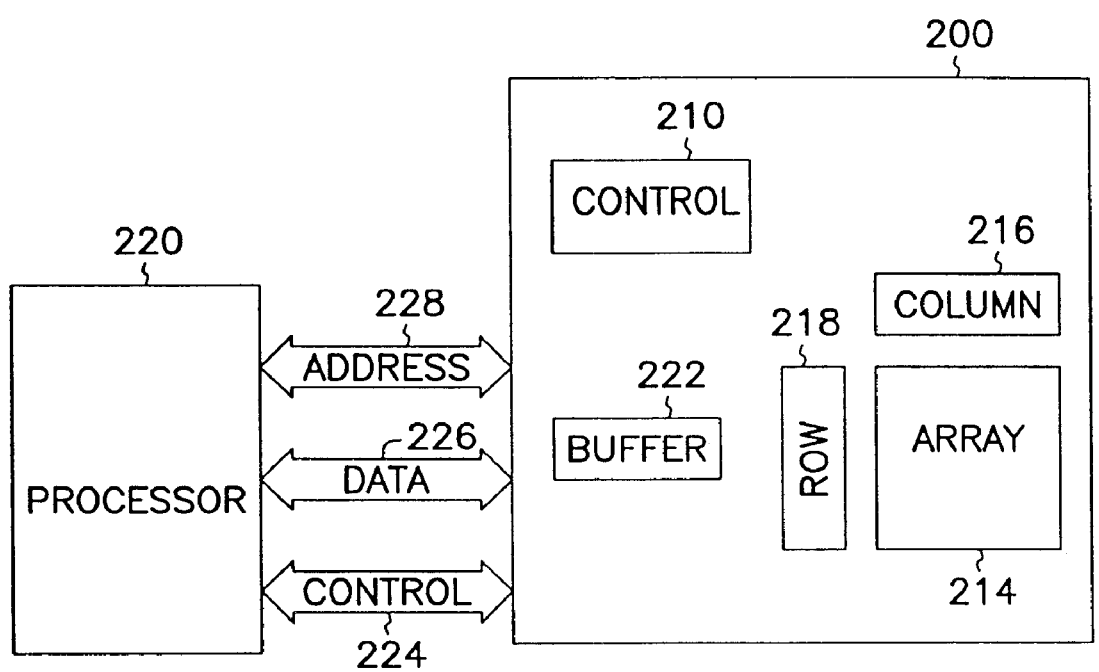
FIG. 7 is a block diagram of a system of the present invention.

FIG. 7 illustrates an integrated circuit device including the antifuse detection circuit. The device can be a memory circuit 200 such is a dynamic random access memory (DRAM) which is coupled to a processor 220. The memory device can be coupled to a processor 220 such as a microprocessor of a personal computer. The memory device 200 includes a memory array 214 having rows and columns of memory cells. The array includes both primary and redundant memory cells. Column decoder 216 and row decoder 218 are provided to access the memory array in response to address signals provided by the processor 220 on address communication lines 228. Data communication is conducted via I/O buffer circuitry 222 and bi-directional data communication lines 226 (DQ). Internal control circuitry 210 accesses the memory array in response to commands provided by the processor 220 on control lines 224. The control circuitry includes antifuses and detection circuitry described in detail above. The antifuses can be used for numerous purposes, but are particularly useful in redundant circuitry for enabling redundant memory cells to replace defective primary cells. That is, after detecting a defective primary memory cell in the memory, an antifuse can be programmed to substitute the defectives cell with a redundant memory cell. The control lines can include Row Address strobe (RAS*), Column Address Strobe (CAS*), Write Enable (WE*), and Output Enable (OE*). It will be appreciated by those skilled in the art that the present invention is equally applicable to other types of memory devices including, but not limited to, SRAM, SDRAM, EDO, Burst EDO, and VRAM.

It will be appreciated by those skilled in the art that variations of the latch and program circuits can be provided without departing from the present invention. As such transistors 110–122 can be either p-channel or n-channel, or eliminated from the latch circuit entirely. Further, the programming circuitry described is one embodiment and numerous alternative programing circuits known to one skilled in the art can be used with the present invention.

CONCLUSION

An antifuse detection circuit has been described which uses a latching circuit and two antifuses. The antifuses are coupled between the latch circuit and ground. The latching circuit described is a differential circuit which can detect which one of the two antifuses has been programmed. The circuit accurately detects an antifuse which has a relatively high resistance after being programmed.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A system comprising:
a first antifuse having a first state;
a second antifuse having a second state; and
a single pair of cross-coupled P-channel transistors coupled between the first antifuse and the second antifuse to latch the first state of the first antifuse.

2. The system of claim 1 wherein:
the second antifuse comprises an unprogrammed antifuse; and
the first antifuse comprises a programmed antifuse or a partially programmed antifuse.

3. The system of claim 1 wherein:
the first antifuse comprises an unprogrammed antifuse; and
the second antifuse comprises a programmed antifuse or a partially programmed antifuse.

4. The system of claim 1 wherein:
the single pair of cross-coupled P-channel transistors comprise:
a first P-channel transistor having a drain coupled to a positive voltage supply, a source, and a gate; and
a second P-channel transistor having a drain coupled to the positive voltage supply, a source coupled to the gate of the first P-channel transistor, and a gate coupled to the source of the first P-channel transistor;
the first antifuse comprises a first plate coupled to a ground potential, and a second plate coupled to the source of the first P-channel transistor;
the second antifuse comprises a first plate coupled to the ground potential, and a second plate coupled to the source of the second P-channel transistor; and
the system comprises an integrated circuit device and further comprises:
program circuitry coupled to the first antifuse and to the second antifuse;
a first biased transistor coupled between the source of the first P-channel transistor and the gate of the second P-channel transistor;
a second biased transistor coupled between the source of the second P-channel transistor and the gate of the first P-channel transistor,
a third biased transistor coupled between the first biased transistor and the second plate of the first antifuse; and
a fourth biased transistor coupled between the second biased transistor and the second plate of the second antifuse.

5. A system comprising:
a processor; and
an integrated circuit device coupled to the processor, the integrated circuit device comprising:
a first antifuse having a first state;
a second antifuse having a second state: and
a single pair of cross-coupled P-channel transistors coupled between the first antifuse and the second antifuse to latch the first state of the first antifuse.

6. The system of claim 5 wherein:
the second antifuse comprises an unprogrammed antifuse; and
the first antifuse comprises a programmed antifuse or a partially programmed antifuse.

7. The system of claim 5 wherein:
the first antifuse comprises an unprogrammed antifuse; and
the second antifuse comprises a programmed antifuse or a partially programmed antifuse.

8. The system of claim 5 wherein:
the single pair of cross-coupled P-channel transistors comprise:
a first P-channel transistor having a drain coupled to a positive voltage supply, a source, and a gate; and
a second P-channel transistor having a drain coupled to the positive voltage supply, a source coupled to the gate of the first P-channel transistor, and a gate coupled to the source of the first P-channel transistor;
the first antifuse comprises a first plate coupled to a ground potential, and a second plate coupled to the source of the first P-channel transistor;

the second antifuse comprises a first plate coupled to the ground potential, and a second plate coupled to the source of the second P-channel transistor; and the integrated circuit device comprises a memory device and further comprises:
 a control circuit;
 an array of primary memory cells and redundant memory cells;
 a programming circuit;
 a column decoder;
 a row decoder;
 communication lines coupled between the processor and the memory device;
 a buffer circuit;
 program circuitry coupled to the first antifuse and to the second antifuse;
 a first biased transistor coupled between the source of the first P-channel transistor and the gate of the second P-channel transistor;
 a second biased transistor coupled between the source of the second P-channel transistor and the gate of the first P-channel transistor;
 a third biased transistor coupled between the first biased transistor and the second plate of the first antifuse; and
 a fourth biased transistor coupled between the second biased transistor and the second plate of the second antifuse.

9. A method comprising:
 selecting a circuit in a system;
 programming a selected one of a pair of antifuses to address the selected circuit; and
 latching a state of the pair of antifuses comprising latching a first node coupled to a first antifuse and latching a second node coupled to a second antifuse with a single pair of cross-coupled P-channel transistors.

10. The method of claim 9 wherein latching a state of the pair of antifuses further comprises coupling a positive voltage supply to a drain of each of a first P-channel transistor and a second P-channel transistor, a gate of the first P-channel transistor being coupled to a source of the second P-channel transistor and the second node, and a gate of the second P-channel transistor being coupled to a source of the first P-channel transistor and the first node.

11. The method of claim 9 further comprising:
 programming the selected one of the pair of antifuses with program circuitry coupled to the pair of antifuses;
 reducing a voltage potential on the first node and the second node with a first pair of biased transistors;
 reducing a voltage potential on the first antifuse and on the second antifuse with a second pair of biased transistors;
 wherein the system comprises an integrated circuit memory device;
 wherein selecting a circuit comprises:
  detecting a defective memory cell in the memory device; and
  selecting a redundant memory cell to replace the defective memory cell; and
 wherein programming a selected one of a pair of antifuses comprises programming a first antifuse and leaving a second antifuse unprogrammed in a pair of antifuses to address the selected redundant memory cell.

12. A method of operating a memory device comprising:
 detecting a defective memory cell in a memory device;
 selecting a redundant memory cell to replace the defective memory cell;
 programming a selected one of a pair of antifuses to address the selected redundant memory cell; and
 latching a state of the pair of antifuses comprising latching a first node coupled to a first antifuse and latching a second node coupled to a second antifuse with a single pair of cross-coupled P-channel transistors.

13. The method of claim 12 wherein latching a state of the pair of antifuses further comprises coupling a positive voltage supply to a drain of each of a first P-channel transistor and a second P-channel transistor, a gate of the first P-channel transistor being coupled to a source of the second P-channel transistor and the second node, and a gate of the second P-channel transistor being coupled to a source of the first P-channel transistor and the first node.

14. The method of claim 12, further comprising:
 programming the selected one of the pair of antifuses with program circuitry coupled to the pair of antifuses;
 reducing a voltage potential on the first node and on the second node with a first pair of biased transistors;
 reducing a voltage potential on the first antifuse and on the second antifuse with a second pair of biased transistors; and
 wherein the memory device is an integrated circuit memory device.

15. An antifuse circuit comprising:
 a single pair of cross-coupled transistors comprising a first transistor comprising a first terminal coupled to a positive voltage supply, a gate, and a second terminal, and a second transistor comprising a first terminal coupled to the positive voltage supply, a gate coupled to the second terminal of the first transistor, and a second terminal coupled to the gate of the first transistor;
 a first antifuse coupled between a reference voltage and the second terminal of the first transistor, the first antifuse having a first state; and
 a second antifuse coupled between the reference voltage and the second terminal of the second transistor, the second antifuse having a second state, the gate of the first transistor and the gate of the second transistor to be latched to opposite states by the cross-coupled transistors determined by the first state of the first antifuse and the second state of the second antifuse.

16. The circuit of claim 15 wherein:
 the second antifuse comprises an unprogrammed antifuse;
 the first antifuse comprises a programmed antifuse or a partially programmed antifuse; and
 the single pair of cross-coupled transistors comprise a single pair of cross-coupled P-channel transistors.

17. The circuit of claim 15 wherein:
 the first transistor further comprises a first P-channel transistor having a drain coupled to the positive voltage supply, a source, and a gate;
 the second transistor further comprises a second P-channel transistor having a drain coupled to the positive voltage supply, a source coupled to the gate of the first P-channel transistor, and a gate coupled to the source of the first P-channel transistor
 the first antifuse further comprises a first plate coupled to a ground potential and a second plate coupled to the gate of the second P-channel transistor,
 the second antifuse further comprises a first plate coupled to the ground potential and a second plate coupled to the gate of the first P-channel transistor; and the circuit comprises an integrated circuit device and further comprises:
  program circuitry coupled to the first antifuse and to the second antifuse;
  a first biased transistor coupled between the source of the first P-channel transistor and the gate of the second P-channel transistor;
  a second biased transistor coupled between the source of the second P-channel transistor and the gate of the first P-channel transistor:
  a third biased transistor coupled between the gate of the second P-channel transistor and the second plate of the first antifuse; and
  a fourth biased transistor coupled between the gate of the first P-channel transistor and the second plate of the second antifuse.

18. A method of detecting an antifuse comprising:
  coupling a first plate of a first antifuse to a reference voltage, the first antifuse having a first state;
  coupling a first plate of a second antifuse to the reference voltage, the second antifuse having a second state;
  coupling a positive voltage supply to a first terminal of each of a first transistor and a second transistor, a gate of the first transistor being coupled to a second terminal of the second transistor, and a gate of the second transistor being coupled to a second terminal of the first transistor; and
  latching the first state of the first antifuse at a first node coupling a second plate of the first antifuse to the gate of the second transistor and latching the second state of the second antifuse at a second node coupling a second plate of the second antifuse to the gate of the first transistor.

19. The method of claim 18, further comprising:
  reducing a voltage potential on the gate of the first transistor and on the gate of the second transistor with a first pair of biased transistors;
  reducing a voltage potential on the second plate of the first antifuse and on the second plate of the second antifuse with a second pair of biased transistors;
  detecting a defective memory cell in an integrated circuit memory device;
  selecting a redundant memory cell to replace the defective memory cell;
  programming a selected one of the first antifuse and the second antifuse with program circuitry coupled to the first antifuse and the second antifuse to address the selected redundant memory cell; and
  wherein coupling a positive voltage supply further comprises coupling the positive voltage supply to a drain of each of a first P-channel transistor and a second P-channel transistor, a gate of the first P-channel transistor being coupled to a source of the second P-channel transistor and the second plate of the second antifuse, and a gate of the second P-channel transistor being coupled to a source of the first P-channel transistor and the second plate of the first antifuse.

20. An antifuse circuit comprising:
  a first antifuse having a first state;
  a second antifuse having a second state; and
  means for detecting the first state of the first antifuse and the second state of the second antifuse.

21. A system comprising;
  a processor; and
  an integrated circuit device coupled to the processor, the integrated circuit device comprising:
  a single pair of cross-coupled transistors comprising a first transistor comprising a first terminal coupled to a positive voltage supply, a gate, and a second terminal, and a second transistor comprising a first terminal coupled to the positive voltage supply, a gate coupled to the second terminal of the first transistor, and a second terminal coupled to the gate of the first transistor;
  a first antifuse coupled between a reference voltage and the second terminal of the first transistor, the first antifuse having a first state; and
  a second antifuse coupled between the reference voltage and the second terminal of the second transistor, the second antifuse having a second state, the gate of the first transistor and the gate of the second transistor to be latched to opposite states by the cross-coupled transistors determined by the first state of the first antifuse and the second state of the second antifuse.

22. The system of claim 21 wherein:
  the second antifuse comprises an unprogrammed antifuse;
  the first antifuse comprises a programmed antifuse or a partially programmed antifuse; and
  the single pair of cross-coupled transistors comprise a single pair of cross-coupled P-channel transistors.

23. The system of claim 21 wherein:
  the first transistor further comprises a first P-channel transistor having a drain coupled to the positive voltage supply, a source, and a gate;
  the second transistor further comprises a second P-channel transistor having a drain coupled to the positive voltage supply, a source coupled to the gate of the first P-channel transistor, and a gate coupled to the source of the first P-channel transistor;
  the first antifuse further comprises a first plate coupled to a ground potential and a second plate coupled to the gate of the second P-channel transistor;
  the second antifuse further comprises a first plate coupled to the ground potential and a second plate coupled to the gate of the first P-channel transistor; and
  the integrated circuit device comprises a memory device and further comprises:
    a control circuit;
    an array of primary memory cells and redundant memory cells;
    a programming circuit;
    a column decoder;
    a row decoder;
    communication lines coupled between the processor and the memory device;
    a buffer circuit;
    program circuitry coupled to the first antifuse and to the second antifuse;
    a first biased transistor coupled between the source of the first P-channel transistor and the gate of the second P-channel transistor;
    a second biased transistor coupled between the source of the second P-channel transistor and the gate of the first P-channel transistor;
    a third biased transistor coupled between the gate of the second P-channel transistor and the second plate of the first antifuse; and
    a fourth biased transistor coupled between the gate of the first P-channel transistor and the second plate of the second antifuse.

24. A method of operating a memory device comprising:

detecting a defective memory cell in a memory device;

selecting a redundant memory cell to replace the defective memory cell;

programming a selected one of a first antifuse and a second antifuse in the memory device to address the selected redundant memory cell;

coupling a first plate of the first antifuse to a reference voltage, the first antifuse having a first state;

coupling a first plate of the second antifuse to the reference voltage, the second antifuse having a second state;

coupling a positive voltage supply to a first terminal of each of a first transistor and a second transistor in the memory device, a gate of the first transistor being coupled to a second terminal of the second transistor, and a gate of the second transistor being coupled to a second terminal of the first transistor; and latching the first state of the first antifuse at a first node coupling a second plate of the first antifuse to the gate of the second transistor and latching the second state of the second antifuse at a second node coupling a second plate of the second antifuse to the gate of the first transistor.

25. The method of claim 24, further comprising:

reducing a voltage potential on the gate of the first transistor and on the gate of the second transistor with a first pair of biased transistors;

reducing a voltage potential on the second plate of the first antifuse and on the second plate of the second antifuse with a second pair of biased transistors;

programming the selected one of the first antifuse and the second antifuse with program circuitry coupled to the first antifuse and the second antifuse; and wherein coupling a positive voltage supply further comprises coupling the positive voltage supply to a drain of each of a first P-channel transistor and a second P-channel transistor, a gate of the first P-channel transistor being coupled to a source of the second P-channel transistor and the second plate of the second antifuse, and a gate of the second P-channel transistor being coupled to a source of the first P-channel transistor and the second plate of the first antifuse; and wherein the memory device is an integrated circuit memory device.

* * * * *

UNITED STATES PATENT AND TRADEMARK OFFICE
CERTIFICATE OF CORRECTION

PATENT NO. : 6,633,506 B2  Page 1 of 1
DATED : October 14, 2003
INVENTOR(S) : Stephen L. Casper and Chris G. Martin It is certified that error appears in the above-identified patent and that said Letters Patent is hereby corrected as shown below:

Column 5,
Line 3, delete "is" and insert -- as -- therefor.

Column 7,
Line 45, insert -- , -- after "claim 9".

Column 8,
Line 61, insert -- ; -- after "transistor".
Line 64, delete "," and insert -- ; -- after "transistor".

Column 9,
Line 10, delete ":" and insert -- ; -- after "transistor".
Line 64, delete ";" and insert -- : -- after "comprising".

Signed and Sealed this

Fifteenth Day of June, 2004

JON W. DUDAS
*Acting Director of the United States Patent and Trademark Office*